United States Patent
Lin et al.

(10) Patent No.: US 11,417,666 B2
(45) Date of Patent: Aug. 16, 2022

(54) DYNAMIC RANDOM ACCESS MEMORY AND METHOD OF MANUFACTURING THE SAME

(71) Applicant: Winbond Electronics Corp., Taichung (TW)

(72) Inventors: Chang-Hung Lin, Taichung (TW); Feng-Jung Chang, Taichung (TW); Tzu-Ming Ou Yang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 69 days.

(21) Appl. No.: 16/919,086

(22) Filed: Jul. 1, 2020

(65) Prior Publication Data

US 2021/0005614 A1     Jan. 7, 2021

(30) Foreign Application Priority Data

Jul. 4, 2019   (TW) ................................ 108123635

(51) Int. Cl.
*H01L 27/108*   (2006.01)
*H01L 21/762*   (2006.01)

(52) U.S. Cl.
CPC .. *H01L 27/10876* (2013.01); *H01L 21/76224* (2013.01); *H01L 27/10808* (2013.01); *H01L 27/10823* (2013.01)

(58) Field of Classification Search
CPC ......... H01L 27/10823; H01L 27/10873; H01L 27/10876; H01L 27/10891; H01L 21/76224
See application file for complete search history.

(56) References Cited

U.S. PATENT DOCUMENTS

| | | | | |
|---|---|---|---|---|
| 2014/0070291 A1* | 3/2014 | Song | ................. | H01L 27/10855 257/296 |
| 2014/0159148 A1* | 6/2014 | Chung | .............. | H01L 27/10876 257/330 |
| 2015/0333059 A1* | 11/2015 | Lee | ................... | H01L 27/10876 257/334 |
| 2017/0040327 A1* | 2/2017 | Nobuto | ............. | H01L 21/28568 |
| 2017/0301569 A1* | 10/2017 | Lee | ................... | H01L 27/10891 |
| 2018/0342613 A1* | 11/2018 | Chang | ............... | H01L 27/10891 |
| 2020/0388619 A1* | 12/2020 | Sukekawa | ......... | H01L 23/53257 |

* cited by examiner

*Primary Examiner* — Nelson Garces
(74) *Attorney, Agent, or Firm* — JCIPRNET

(57) ABSTRACT

Provided is a method of manufacturing a DRAM. A plurality of openings are formed in the substrate. A hard mask is formed on the sidewall of an upper part of each opening. The substrate and the hard mask are partially removed to form a plurality of isolation trenches and to define active regions. Each active region is located between the isolation trenches and remaining portions of the hard mask are located on two sides of each active region. The isolation trenches and the openings are filled with a dielectric layer. The substrate and the dielectric layer are partially removed to form a plurality of buried word line trenches. Each buried word line trench extends along a third direction and passes through the active regions, the openings and the isolation trenches. A plurality of buried word lines are formed in the buried word line trenches.

8 Claims, 10 Drawing Sheets

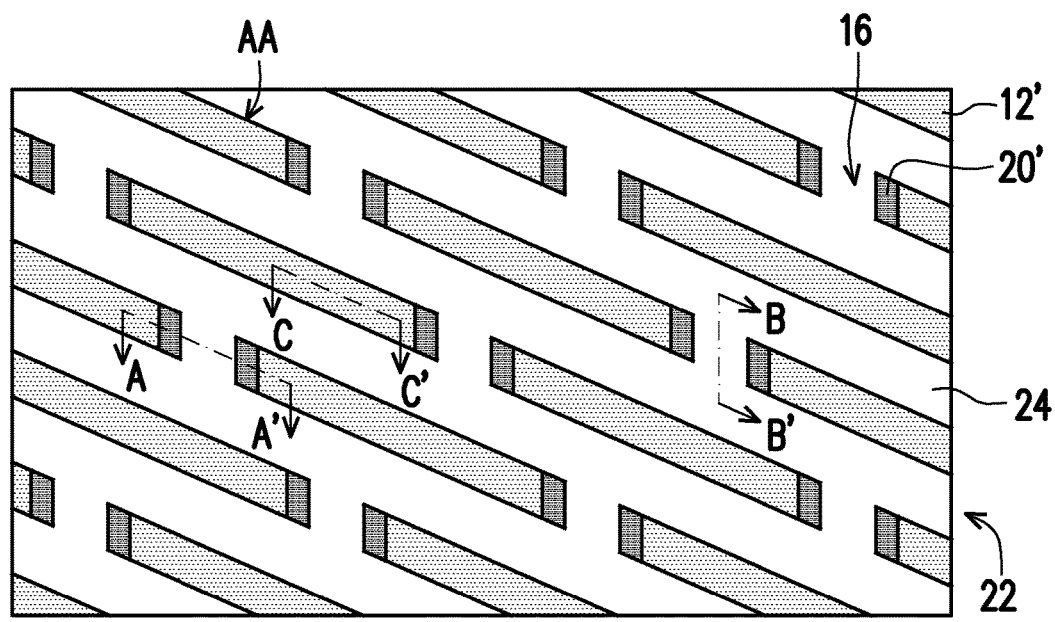
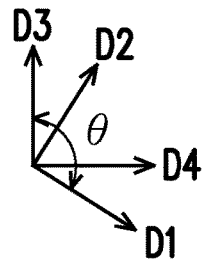
FIG. 6A
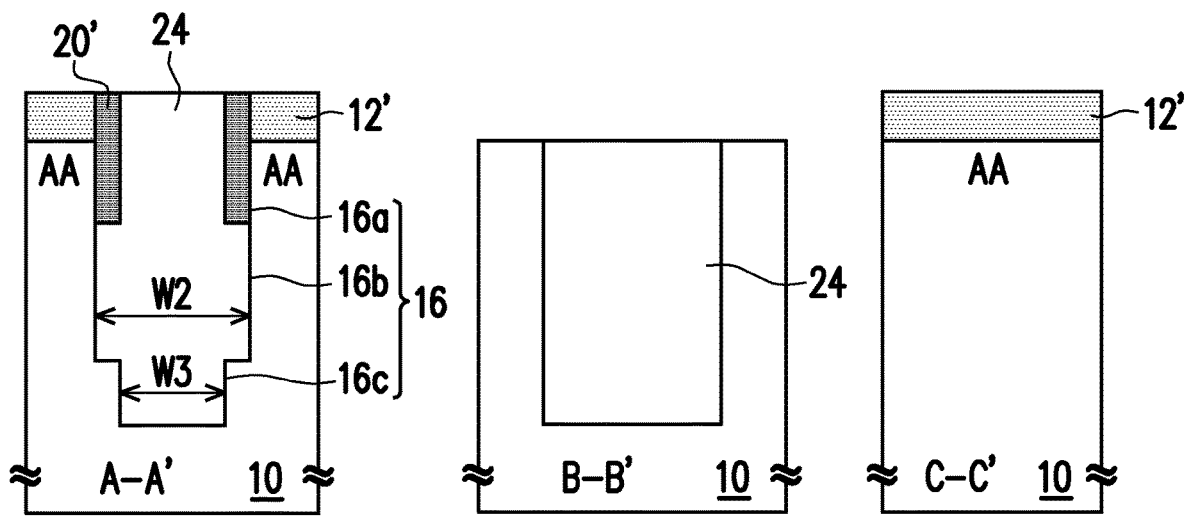
FIG. 6B  FIG. 6C  FIG. 6D

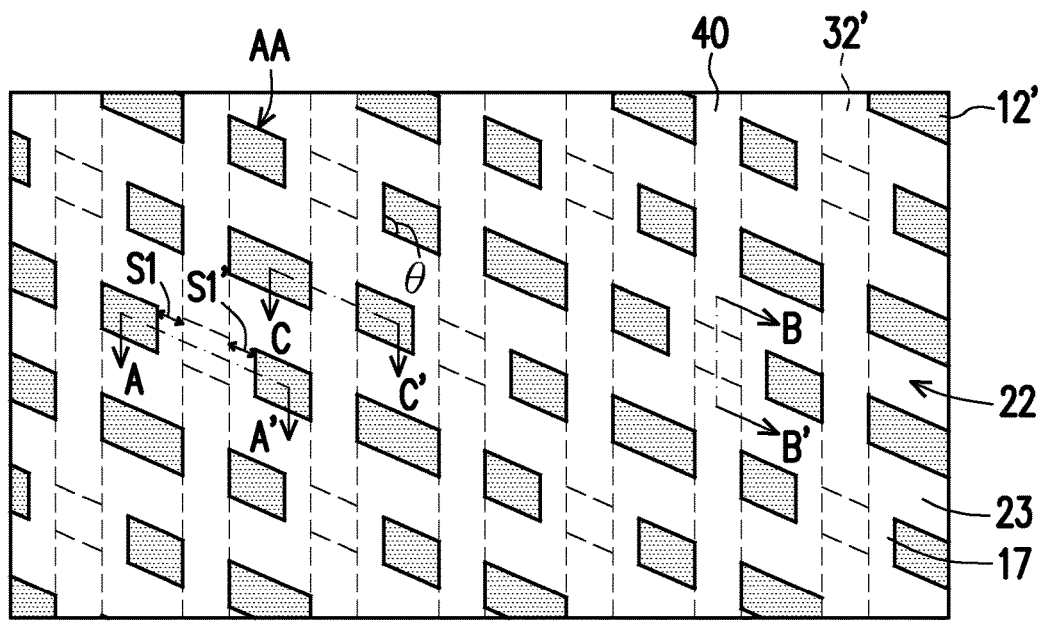
FIG. 9A
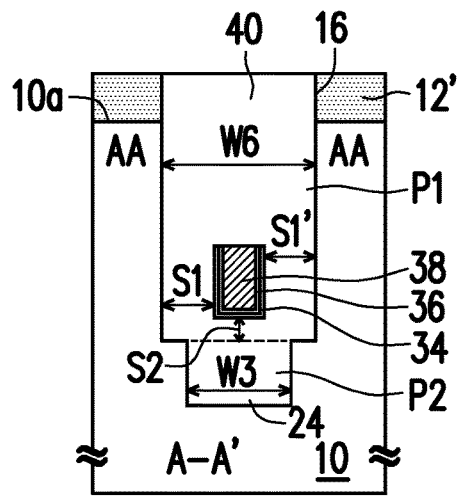 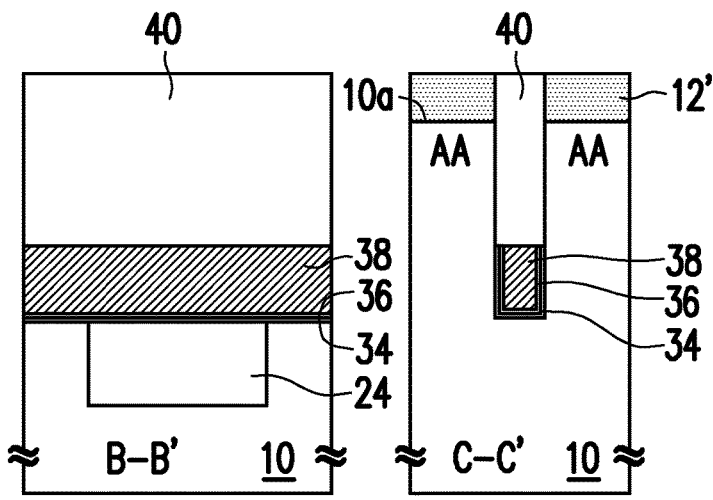
FIG. 9B  FIG. 9C  FIG. 9D

DYNAMIC RANDOM ACCESS MEMORY AND METHOD OF MANUFACTURING THE SAME

CROSS-REFERENCE TO RELATED APPLICATION

This application claims the priority benefit of Taiwan application serial no. 108123635, filed on Jul. 4, 2019. The entirety of the above-mentioned patent application is hereby incorporated by reference herein and made a part of this specification.

BACKGROUND OF THE INVENTION

1. Field of the Invention

The present invention relates to an integrated circuit and a method of manufacturing the same, and in particular, to a dynamic random access memory and a method of manufacturing the same.

2. Description of Related Art

With the rapid change of technologies, in order to meet the demand of customers for miniaturized electronic devices, the designed size of a dynamic random access memory (DRAM) has been shrunk and developed toward high integration. DRAM with buried word lines has been developed in recent years. In the process of manufacturing the DRAM with buried word lines, as the component size shrinks, the margin of the process also becomes smaller. During formation of a buried word line passing through an isolation pattern between active regions, when there is a misalignment during the formation of the buried word line trench, it is prone to cause a short circuit between a buried word line and an active region, thereby resulting in a problem of junction leakage.

SUMMARY OF THE INVENTION

The present invention provides a DRAM and a method of manufacturing the same, so as to increase the margin of a process, lower the risk of a short circuit between the buried word line and the active region and reduce the problem of junction leakage.

The present invention provides a method of manufacturing a DRAM, including the following steps: forming a plurality of openings in a substrate; forming a first hard mask on a sidewall of an upper part of each of the openings; partially removing the substrate and the first hard mask to form a plurality of isolation trenches extending along a first direction and arranged along a second direction, and to define a plurality of active regions, where each active region is located between the isolation trenches, and remaining portions of the first hard mask are located on two sides of each active region; filling the isolation trenches and the openings with a dielectric layer, where a material of the dielectric layer is different from a material of the first hard mask; partially removing the substrate and the dielectric layer to form a plurality of buried word line trenches, where each buried word line trench extends along a third direction and passes through the active regions, the openings and the isolation trenches, and remaining portions of the first hard mask are located on two sides of each buried word line trench; and forming a plurality of buried word lines in the buried word line trenches.

The present invention provides a DRAM, including: a substrate, a plurality of chop structures, a plurality of isolation structures, a plurality of active regions and a plurality of buried word lines. The chop structures are located in the substrate. Each chop structure includes a first portion and a second portion. The first portion is located above the second portion, and the width of the second portion is less than the width of the first portion. The isolation structures are located in the substrate. The isolation structures extend along a first direction and are arranged along a second direction. Each chop structure is located between two adjacent isolation structures. The active regions extend along the first direction. Each active region is located between two adjacent isolation structures and two adjacent chop structures. The buried word lines are located at bottoms of buried word line trenches. The buried word line trenches extend along a third direction and are arranged along a fourth direction. The buried word line trenches pass through the isolation structures, the chop structures and the active regions. A first gap is reserved between portions, passing through the chop structures, of the buried word lines and the active regions.

Based on the above, since the first hard mask is firstly formed on two sides of the predetermined active regions before the isolation trenches are formed in the embodiment of the present invention, the first hard mask may protect the active regions from being damaged by etching due to misalignment during subsequent formation of the buried trenches. Therefore, the method of the embodiment of the present invention can increase the margin of the process, avoid a short circuit between the buried word line and the active region and reduce the problem of junction leakage.

BRIEF DESCRIPTION OF THE DRAWINGS

FIGS. 1A to 9A are top views of manufacturing processes of a method of manufacturing a DRAM according to one embodiment of the present invention;

FIGS. 1B to 9B are cross-sectional views of cut lines A-A' of FIGS. 1A to 9A;

FIGS. 1C to 9C are cross-sectional views of cut lines B-B' of FIGS. 1A to 9A;

FIGS. 5D to 9D are cross-sectional views of cut lines C-C' of FIGS. 5A to 9A;

DESCRIPTION OF THE EMBODIMENTS

Figure 1A:
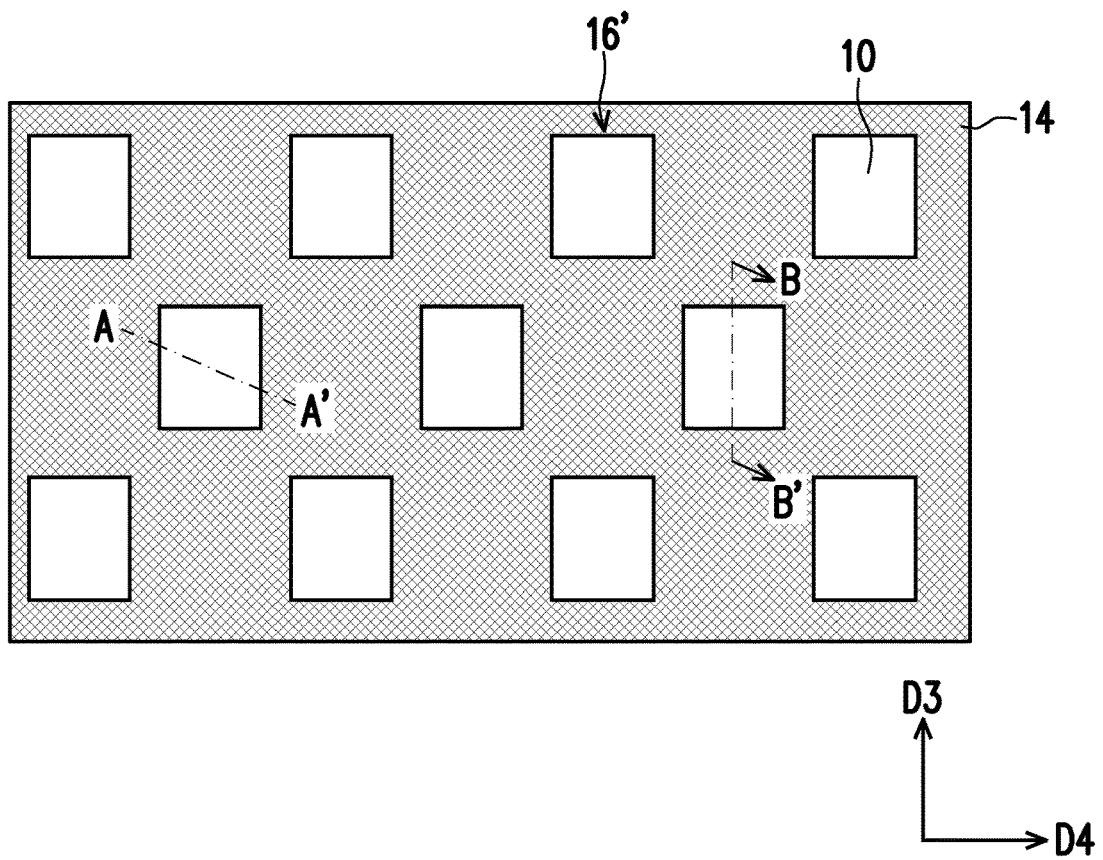

The present invention is described more fully with reference to the drawings of the embodiments. However, the present invention also may be embodied in a variety of different forms and is not limited to the embodiments described herein. The thicknesses of layers and regions in the drawings will be scaled up for clarity. The same or similar reference numerals refer to the same or similar elements, and the descriptions thereof will be no longer repeated in the following paragraphs.

Figures 1B, 1C:
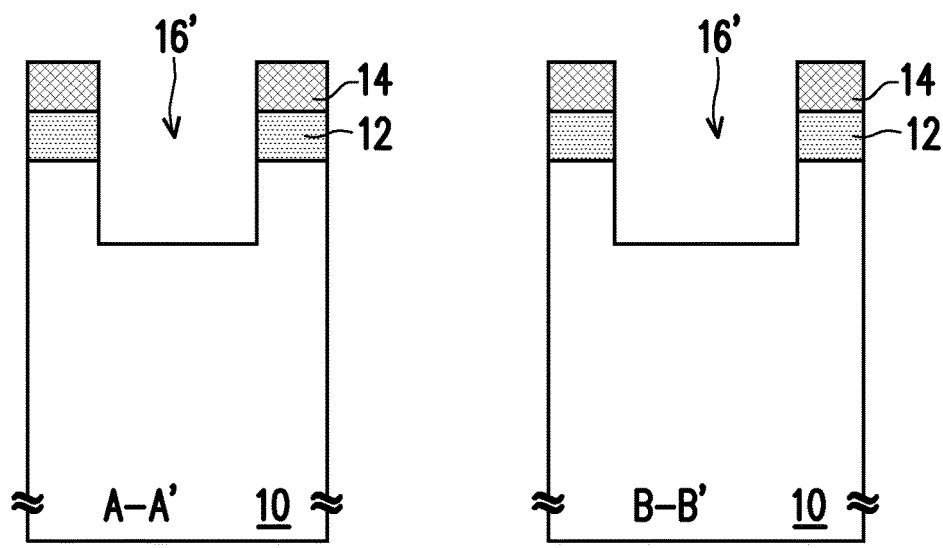

The present embodiment provides a method of manufacturing a DRAM. Referring to FIGS. 1A, 1B and 1C, a substrate 10, for example a silicon substrate, is provided. Next, hard masks 12 and 14 having opening patterns are formed on the substrate 10. A method of forming the hard masks 12 and 14 is, for example, to firstly form two hard mask material layers of different materials and then pattern the hard mask material layers by lithography and etching processes. A material of the hard mask 12 is, for example, silicon oxide, and a forming method thereof is, for example, a thermal oxidation method or a chemical vapor deposition (CVD) method. A material of the hard mask 14 is, for example, aluminum oxide, and a forming method thereof is, for example, a CVD method. Later, an etching process (such as an anisotropic etching process) is performed on the substrate 10 by using the hard mask 14 as a mask, so as to form shallow openings 16'. The shallow openings 16' are, for example, rectangular, but are not limited thereto.

In some embodiments, the shallow openings 16' are arranged along a fourth (row) direction D4 and a third (column) direction D3. The third direction D3 is perpendicular to the fourth direction D4. Two adjacent rows of shallow openings 16' are staggered from each other.

Figure 2A:
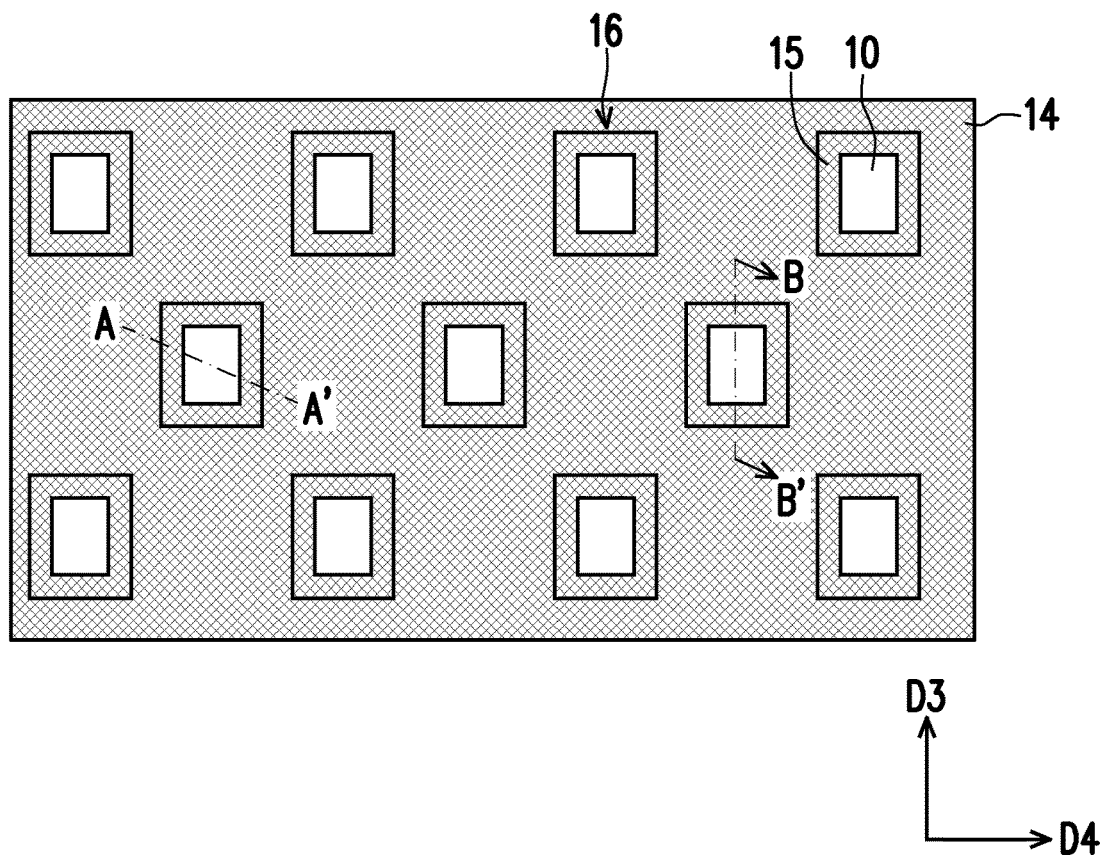
Figures 2B, 2C:
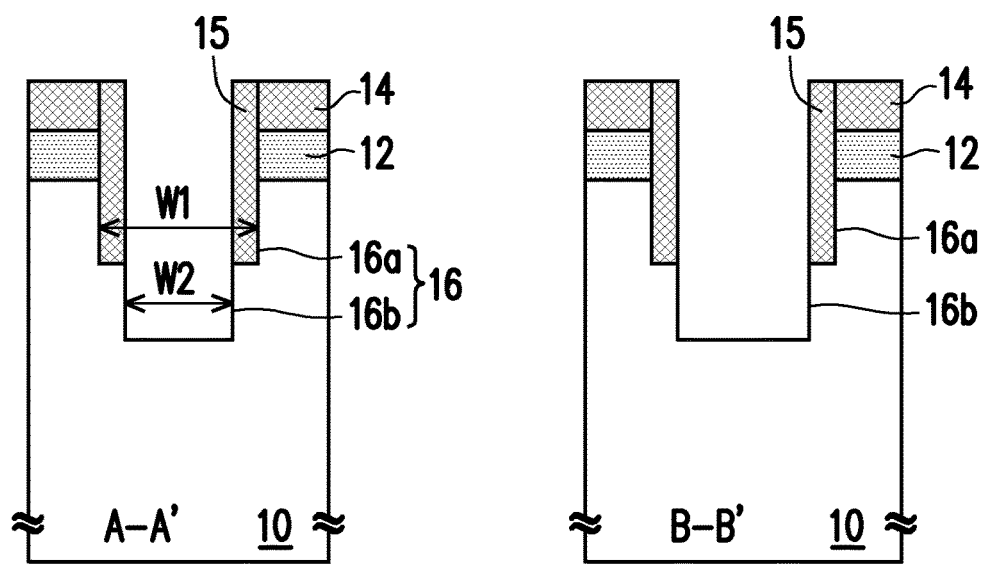

Next, referring to FIGS. 2A, 2B and 2C, a hard mask 15 is formed on the sidewalls of the shallow openings 16'. A material of the hard mask 15 may be the same as that of the hard mask 14, but is different from that of the substrate 10. The hard mask 15 can be formed by, for example, forming a hard mask material layer on the substrate 10 and then removing the hard mask material layer covering a top surface of the hard mask 14 and bottoms of the shallow openings 16' via an etching back process (such as an anisotropic etching process).

Next, by using the hard mask 14 and the hard mask 15 as mask, an etching back process (such as the anisotropic etching process) is performed on the substrate 10 exposed by the shallow openings 16' to form deeper openings 16. The openings 16 include upper parts 16a and lower parts 16b. The width W1 of the upper part 16a is greater than the width W2 of the lower part 16b. The inner sidewall of the upper part 16a is covered by the hard mask 15, and the substrate 10 is exposed by the lower part 16b.

Figure 3A:
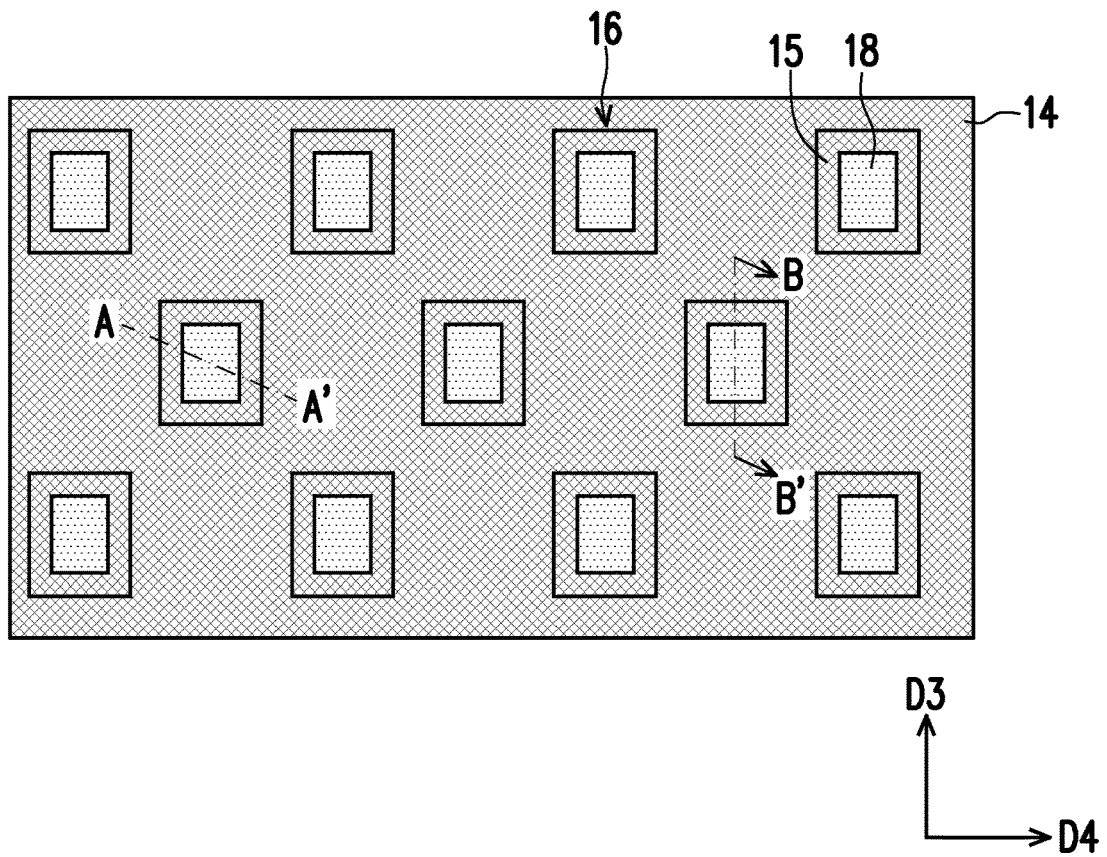
Figures 3B, 3C:
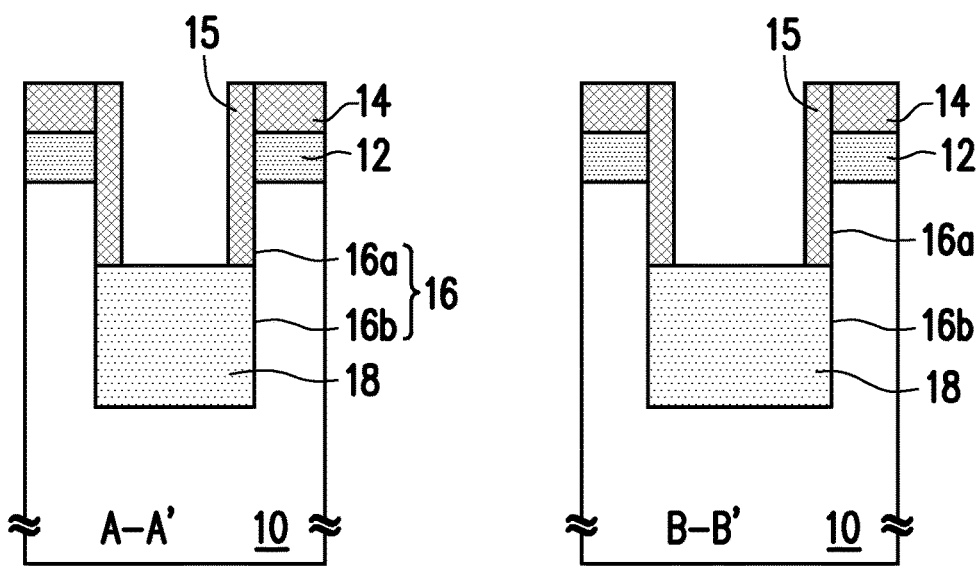

Referring to FIGS. 3A, 3B and 3C, by using the hard mask 14 and the hard mask 15 as mask, an etching process is performed on the substrate 10 exposed by the lower parts 16b of the openings 16, so as to deepen and widen spaces of the lower parts 16b of the openings 16. The etching process may adopt an isotropic etching process, such as a wet etching process using hydrofluoric acid. In FIGS. 3B and 3C, the width of the lower part 16b of the opening 16 may be equal to or greater than the width of the upper part 16a of the opening 16. In addition, the base angle of the lower part 16b of the opening 16 is a right angle, but is not limited thereto. The base angle of the lower part 16b may also be rounded by the control and selection of the etching process. Then, the lower part 16b of the opening 16 is filled with a sacrificial layer 18. A material of the sacrificial layer 18 is different from that of the substrate 10. For example, the sacrificial layer 18 is a spin-coated layer, such as a spin-coated carbon oxide.

Figure 4A:
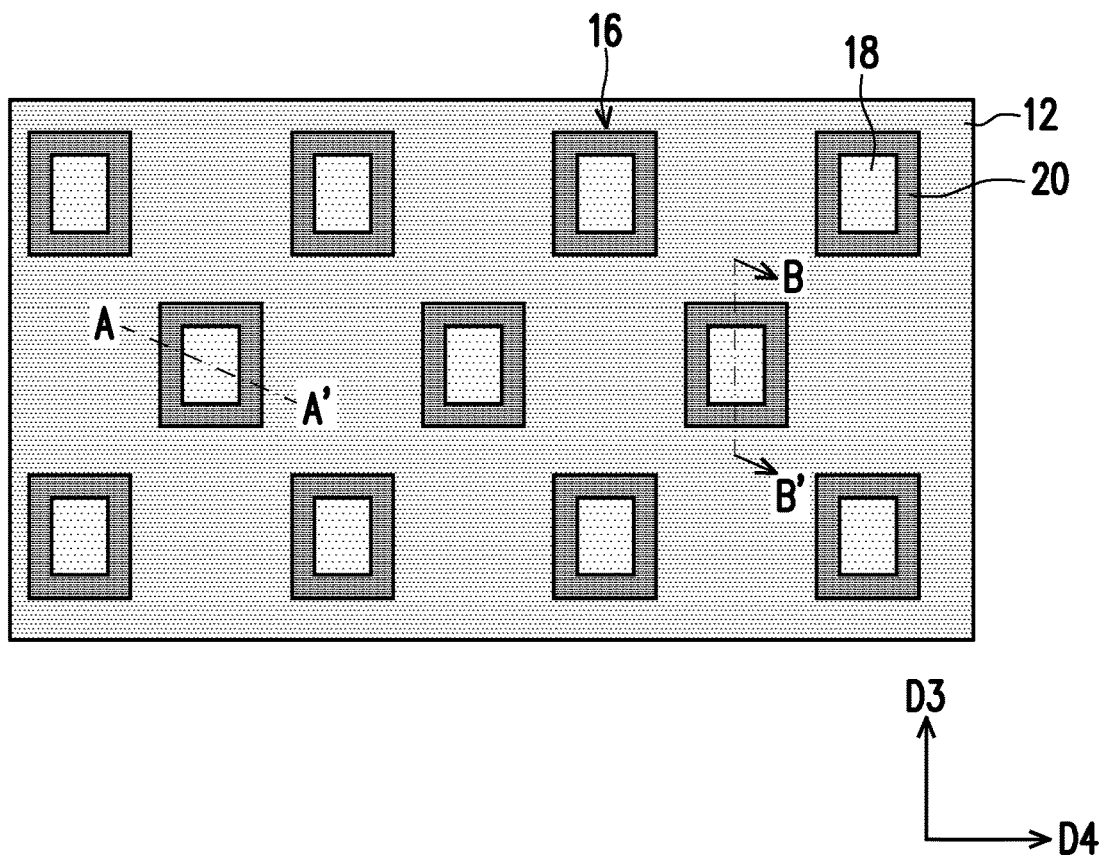
Figure 4B:
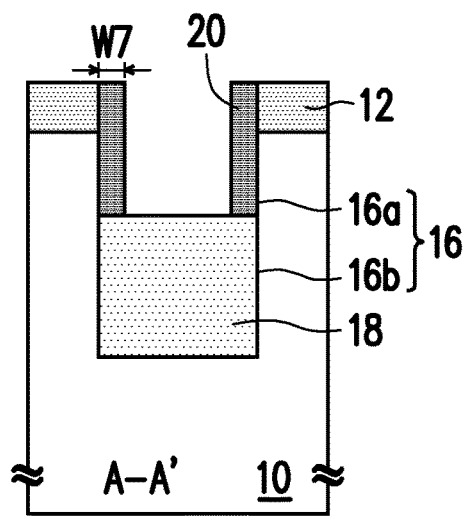
Figure 4C:
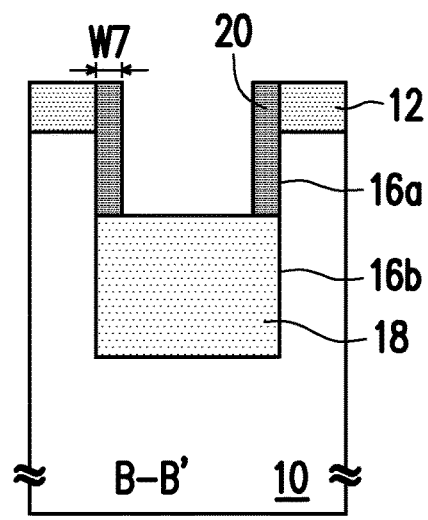
Figure 5A:
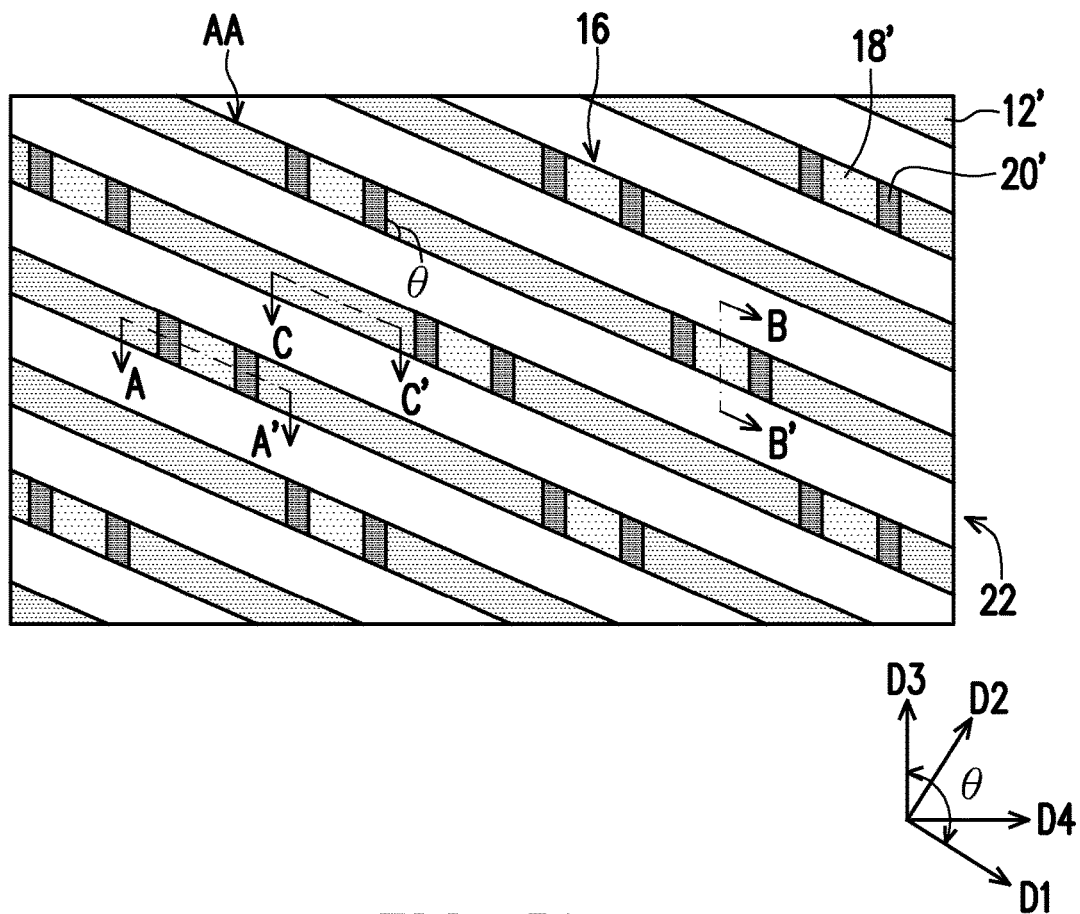
Figures 5B, 5C, 5D:
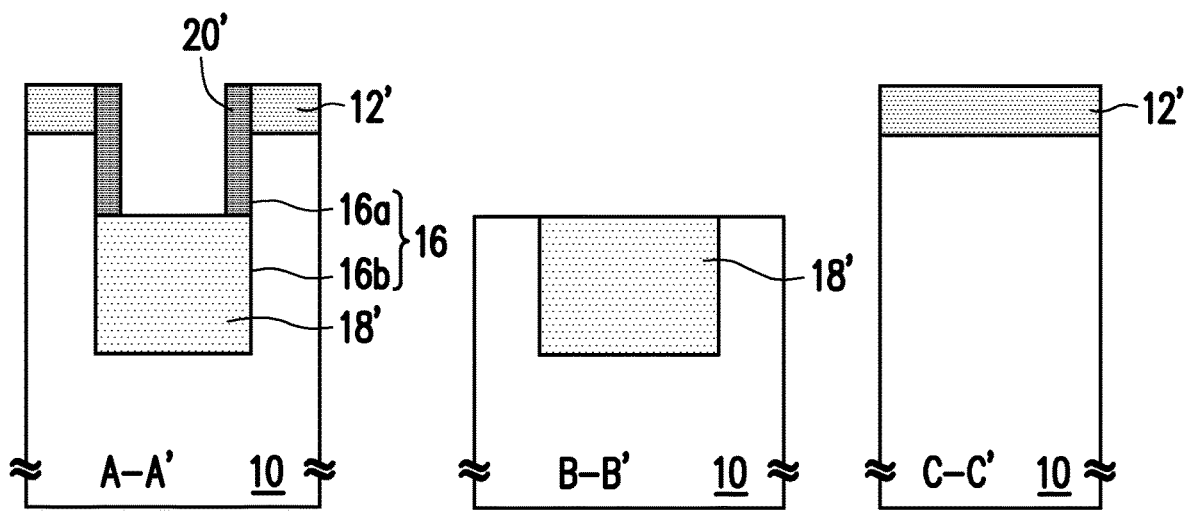

Referring to FIGS. 4A, 4B and 4C, an etching process is performed to remove the hard mask 14 and the hard mask 15. Next, a hard mask 20 is formed on the sidewalls of the upper parts 16a of the openings 16. A material of the hard mask 20 may be an oxide, such as silicon oxide. A method of forming the hard mask 20 is, for example, to firstly form a hard mask material layer on the substrate 10 and then perform an anisotropic etching process. The hard mask material layer may be formed by a CVD method. The hard mask 20 has a width W7 of at least 2 nm, for example 5 nm.

Referring to FIGS. 5A, 5B, 5C and 5D, the hard masks 12 and 20, the sacrificial layer 18 and the substrate 10 are partially removed to form a plurality of isolation trenches 22 extending along a first direction D1 and arranged along a second direction D2, and to define a plurality of active regions AA. Each of the active regions AA is located between these isolation trenches 22. In detail, the hard mask 12 is patterned into hard masks 12'. The hard mask 20 and the sacrificial layer 18 are partially removed to remove portions thereof located at the upper right corners and the lower left corners of the openings 16. And then portions of the substrate 10 not covered are partially removed to form the isolation trenches 22. Namely, the hard masks 12', hard masks 20' and sacrificial layers 18' remain between two adjacent isolation trenches 22. The substrate 10 below the hard masks 12' is the active regions AA. The hard masks 20' are located on two sides of the active regions AA. In the present embodiment, two sides, adjacent to the hard masks 20', of the active regions AA are parallel to the third direction D3, and two sides, adjacent to the isolation trenches 22, of the active regions AA are parallel to the first direction D1. An included angle θ between the first direction D1 and the third direction D3 is, for example, an obtuse angle. In the extending direction (the first direction D1) of the active regions AA, two adjacent active regions AA are separated by the opening 16. In the third direction D3, two adjacent active regions AA are separated by the isolation trench 22.

Referring to FIGS. 6A, 6B, 6C and 6D, the sacrificial layers 18' are completely removed. Then, a process of deepening the openings 16 may be selectively performed. For example, the hard masks 12' and 20' are taken as mask to perform an etching process (such as an anisotropic etching process or an isotropic etching process), so as to deepen the openings 16 and form extended portions 16c below the lower parts 16b of the openings 16. In some embodiments, the width W3 of the extended portion 16c is less than the width W2 of the lower part 16b.

Next, the openings 16 and the isolation trenches 22 are filled with a dielectric layer 24. A material of the dielectric layer 24 is different from materials of the hard masks 12' and 20'. The material of the dielectric layer 24 is, for example, silicon nitride. The dielectric layer 24 is formed by, for example, forming a dielectric material layer on the hard masks 12' and in the openings 16 and the isolation trenches 22 by a CVD method, and then performing an etching process or a chemical mechanical planarization (CMP) process to remove the dielectric material layer on the hard masks 12' and 20' by using the hard masks 12' and 20' as stop layers. Therefore, the top surface of the dielectric layer 24 is coplanar with the top surfaces of the hard masks 12' and 20'.

Referring to FIGS. 7A, 7B, 7C and 7D, the substrate 10 and the dielectric layer 24 are partially removed by lithography and etching processes, so as to form a plurality of buried word line trenches 30. The buried word line trench 30 extends along the third direction D3, and passes through the substrate 10 of the active region AA and the dielectric layer 24 located in the upper part 16a and the lower part 16b of the opening 16 and the isolation trench 22. The hard masks 20' are located between the active regions AA and the buried word line trenches 30.

Referring to FIGS. 8A, 8B, 8C and 8D, a plurality of buried word lines 32 are formed in the buried word line trenches 30. The buried word line 32 may include a liner layer 34 and a conductive layer 38. The liner layer 34 is conformally formed on an inner surface of the buried word line trench 30. The liner layer 34 may be an oxide layer, such as silicon oxide formed by in-situ steam generation (ISSG). A material of the conductive layer 38 includes a metal or a metal alloy, such as tungsten. In some embodiments, the buried word line 32 may also include a barrier layer 36 located between the liner layer 34 and the conductive layer 38. The barrier layer 36 may also be known as an adhesive layer. There may be a single barrier layer 36 or a plurality of barrier layers 36, and a material of the barrier layer 36 includes a metal or a metal nitride, such as titanium, titanium nitride, tantalum, tantalum nitride or a combination thereof. A method of forming the plurality of buried word lines 32 is, for example, to form liner material layer, barrier material layer and conductive material layer on the hard masks 12' and in the buried word line trenches 30, and then perform an etching process or a CMP process to remove the liner material layer, the barrier material layer and the conductive material layer on the hard masks 12'.

Next, referring to FIGS. 9A, 9B, 9C and 9D, an etching back process is performed to partially remove the liner layer 34, the barrier layer 36 and the conductive layer 38, so that a top surface of the buried word line 32' is lower than a top surface 10a of the substrate 10. Then, an etching process is performed to remove the hard masks 20'. Then, the opening 16 and the buried word line trenches 30 are filled with a dielectric layer 40 so as to cover the buried word line 32' by the dielectric layer 40. A material of the dielectric layer 40 is, for example, silicon nitride.

The dielectric layer 40 and the dielectric layer 24 constitute isolation structures 23 and chop structures 17. The isolation structures 23 may be known as shallow trench isolation (STI) structures, located in the isolation trenches 22 of the substrate 10. The chop structures 17 are located in the openings 16 of the substrate 10. The isolation structures 23 extend along the first direction D1 and are arranged along the second direction D2. The chop structures 17 are located between two adjacent isolation structures 23. The chop structures 17 include first portions P1 and second portions P2. The first portion P1 is located above the second portion P2, and the width W3 of the second portion P2 is less than the width W6 of the first portion P1. The active regions AA are located between two adjacent isolation structures 23 and two adjacent chop structures 17.

Figure 7A:
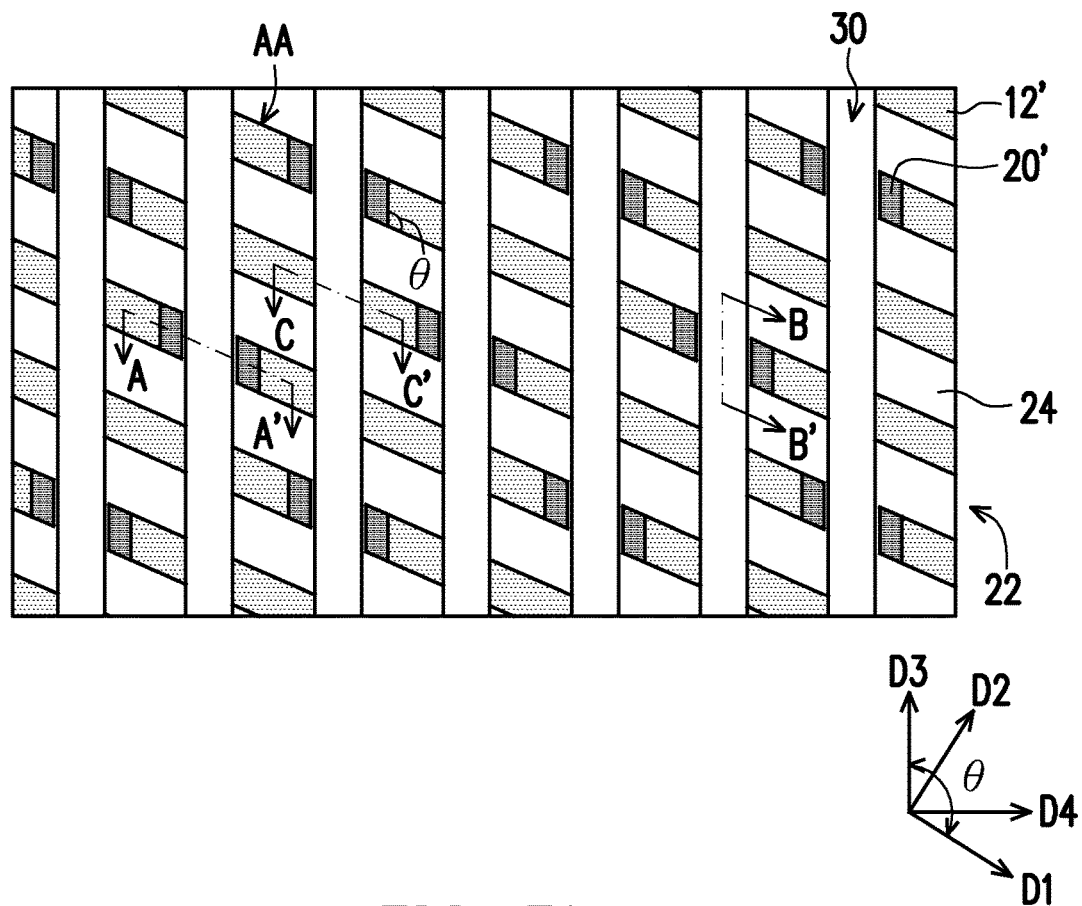
Figures 7B, 7C, 7D:
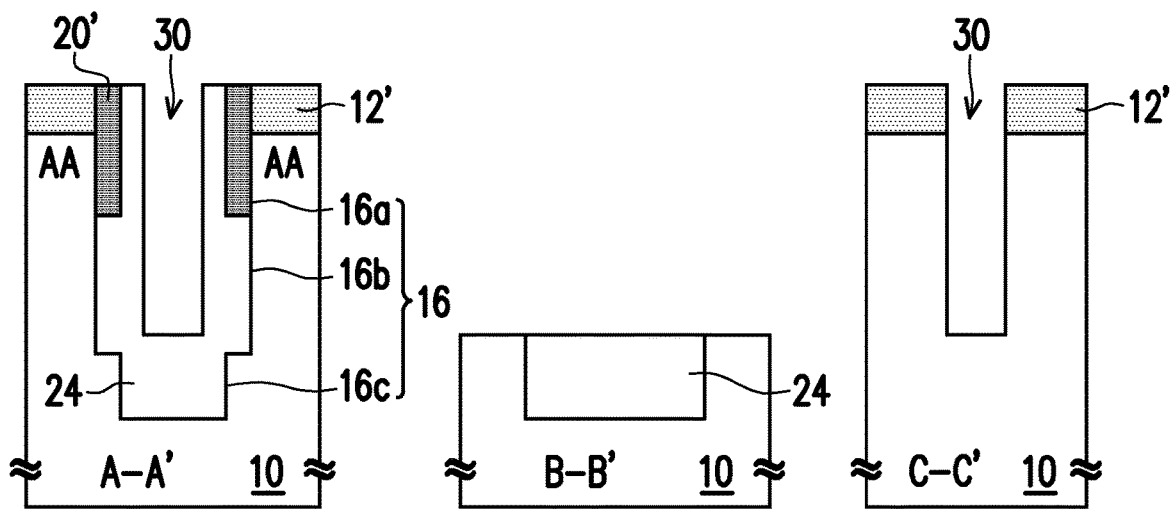
Figure 8A:
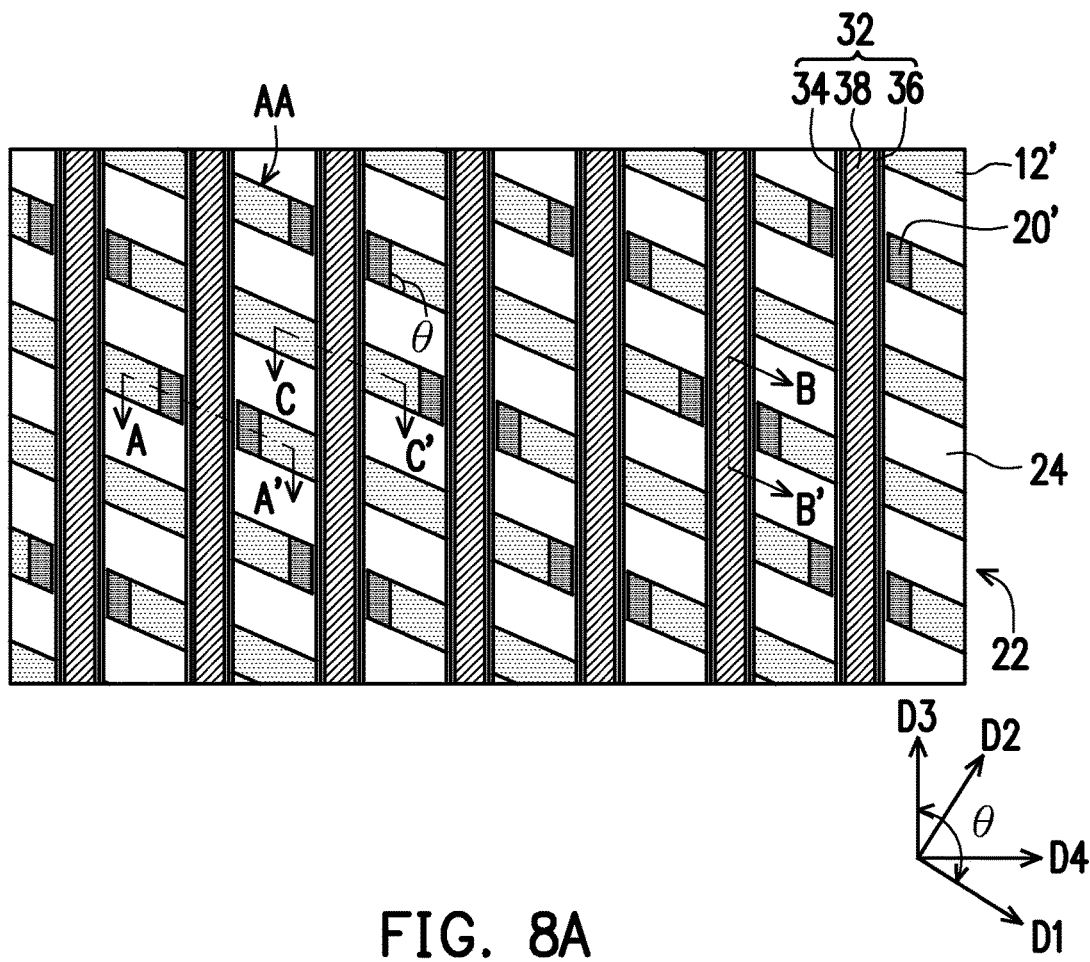
Figures 8B, 8C, 8D:
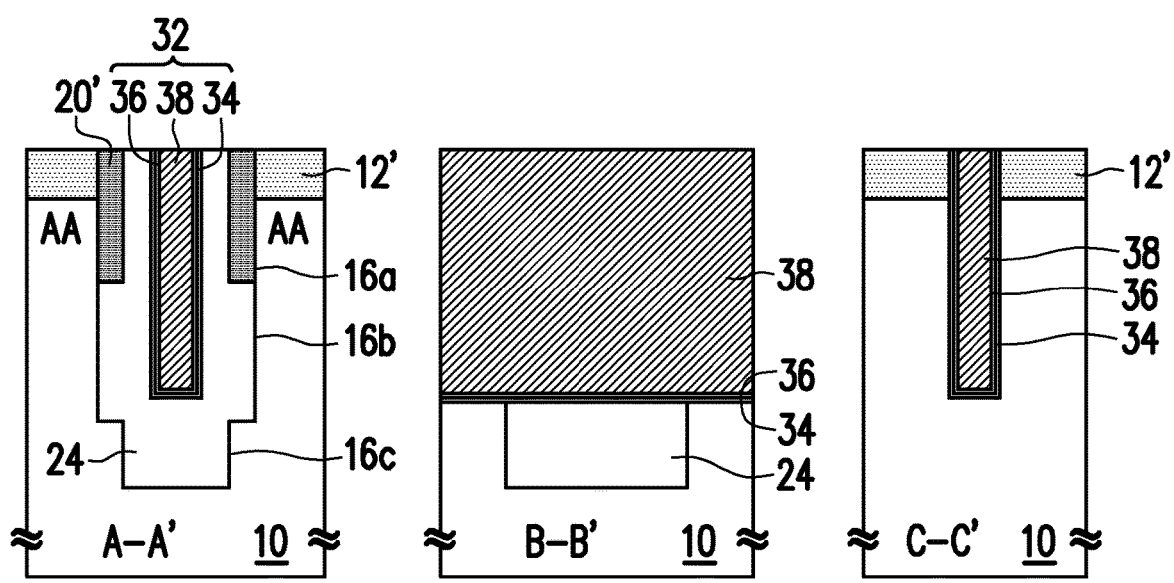

The buried word lines 32' are located at the bottoms of the buried word line trenches 30 (as shown in FIGS. 7B and 7D). The buried word lines 32' extend along the third direction D3 and are arranged along the fourth direction D4. The buried word line 32' passes through the isolation structure 23, the chop structure 17 and the active region AA. The buried word line 32' passes through the first portion P1 of the chop structure 17, and has gaps S1 and S1' from the active region AA. The widths of the gaps S1 and the S1' may be the same or different. In some embodiments, the widths of the gaps S1 and S1' are at least 2 nm. There is a gap S2 between a bottom surface of the buried word line 32' and the second portion P2 of the chop structure 17. In other words, the bottom surface of the buried word line 32' passing through the chop structure 17 is not in direct contact with the second portion P2 or the substrate 10.

Referring to FIGS. 7A, 8A, 7B, 8B, 7D and 8D, in an embodiment of the present invention, the hard masks 20' are formed on the sidewalls of the upper parts 16a of the openings 16 before the buried word line trenches 30 are formed. During the formation of the buried word line trenches 30, if correct alignment is realized or the misalignment is not serious in the lithography process being performed, the buried word line trenches 30 still expose the dielectric layer 24 instead of the hard masks 20'. In addition, the buried word line trenches 30 extending in the third direction D3 have the substantially same widths, and therefore, the subsequently formed buried word lines 32' also have the substantially same widths.

Figure 10A:
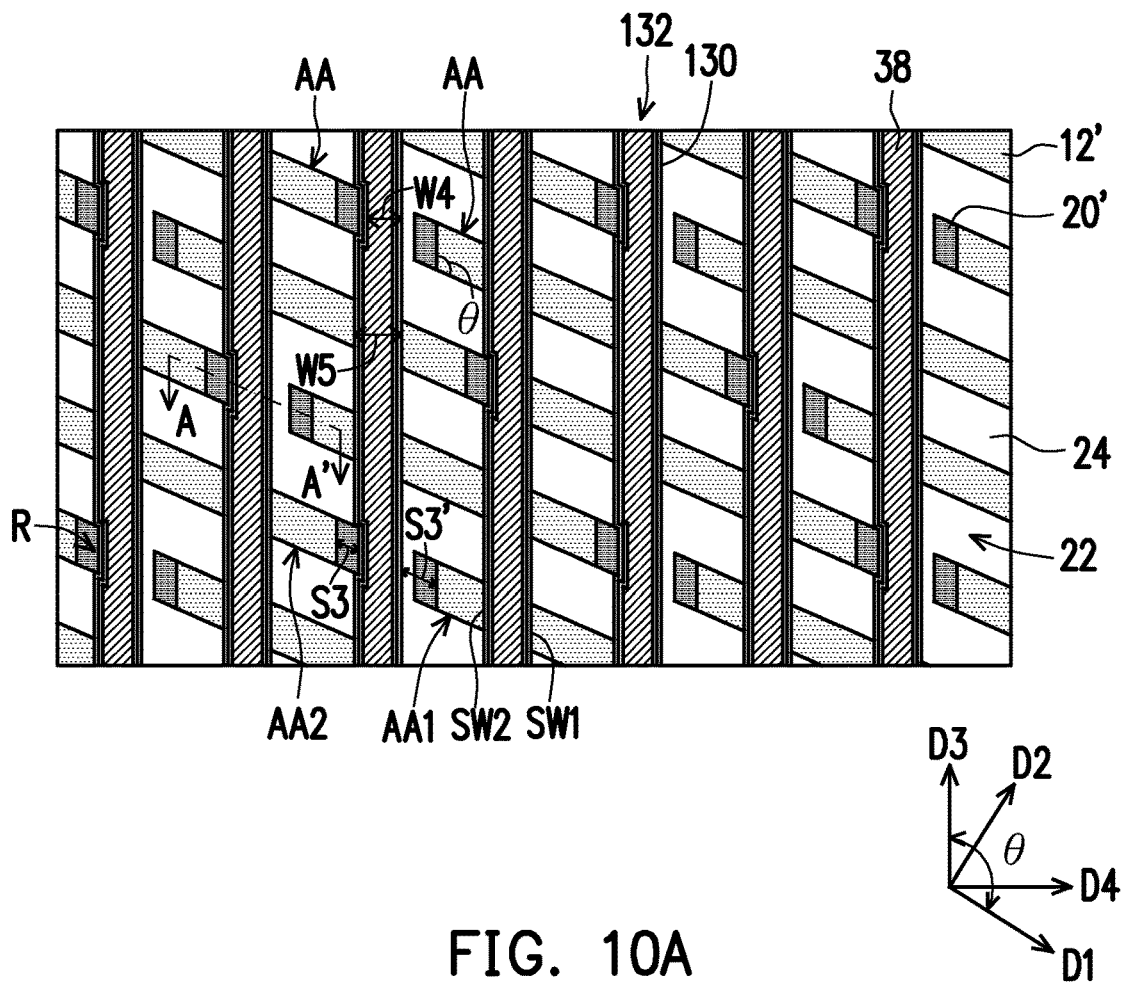
FIG. 10A is a top view of a manufacturing process of a method of manufacturing a DRAM according to another embodiment of the present invention.
Figure 10B:
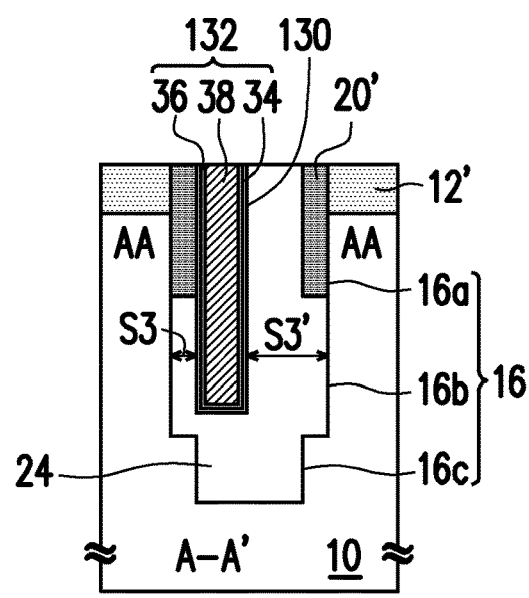
FIG. 10B is a cross-sectional view of a cut line A-A' of FIG. 10A.

Referring to FIGS. 10A and 10B, if serious misalignment occurs in the lithography process performed during formation of the buried word line trenches 130, photoresist patterns defining the buried word line trenches 130 are excursed. In the subsequent etching process, since the material of the hard masks 20' is different from the material of the dielectric layer 24, the hard masks 20' may be taken as mask. Therefore, the active regions AA in the substrate 10 may be prevented from being damaged by the etching. In addition, since the hard masks 20' are hardly etched in the etching process, the formed buried word line trenches 130 may have two different widths. The widths of the buried word line trenches 130 passing through the openings 16 would be less than the widths of the buried word line trenches 130 passing through the isolation trenches 22. Thus, subsequently formed buried word lines 132 may also have two different widths. The widths W4 of the portions, located between two adjacent active regions AA1 and AA2, of the buried word lines 132 would be less than the widths W5 of the portions of the buried word lines 132 passing through the active regions AA. The two buried word lines 132 that pass through the same active region AA2 have the substantially same width W5.

In FIG. 10A, the shapes of the two sidewalls of the buried word line 132 extending in the third direction D3 are different. The sidewall SW1 of the buried word line 132 is a straight line, that is, a flat plane. The other sidewall SW2 of the buried word line 132 is not a straight line, but an uneven line. In other words, the sidewall SW2 of the buried word line 132 is a plane having a notch R. A gap S3 between the sidewall SW2 of the buried word line 132 at the notch R and the active region AA2 is less than a gap S3' between the corresponding sidewall SW1 and the active region AA1.

In a regional range, the notches R are all sidewalls SW2 of the same side of the buried word lines 132. The notches R of the odd-numbered buried word lines 132 are arranged along the fourth direction, and projections thereof on a plane perpendicular to the fourth direction D4 are at least partially overlapped. The notches R of the even-numbered buried word lines 132 are also arranged along the fourth direction, and projections thereof on the plane perpendicular to the fourth direction D4 are at least partially overlapped. However, the notches R of two adjacent buried word lines 132 are staggered from each other, and projections thereof on a plane of the fourth direction D4 are not overlapped.

Next, the subsequent processes are performed, including bit lines, capacitors and the like. The bit lines are perpendicular to the buried word lines 32', and, for example, extend along the fourth direction D4. In some embodiments, two buried word lines may span over each active region AA, and the bit lines are electrically connected to a doped region (source region) in the active region AA between the two buried word lines. The capacitors are electrically connected to a doped region (drain region) in the active region AA beyond the two buried word lines. The subsequent processes may be implemented in accordance with any known methods, and the descriptions thereof are omitted herein.

In an embodiment of the present invention, before the isolation trenches are formed, the openings of the chop structures are firstly formed in the substrate on two sides of the predetermined active regions, and the hard masks are formed on the sidewalls of the openings. The hard masks may protect the active regions from being damaged by the etching due to the misalignment during the subsequent formation of the buried trenches. Therefore, the method of the embodiment of the present invention can increase the margin of the process, lower or avoid the risk of the short circuit between the buried word line and the active region in the subsequent processes, and reduce the problem of junction leakage.

Although the present invention has been disclosed as above with the embodiments, but the embodiments are not intended to limit the present invention. Any one of ordinary skill in the art can make some changes and refinements without departing from the spirit and scope of the present invention. Therefore, the protection scope of the present invention shall be defined by the scope of the appended claims.

What is claimed is:

1. A method of manufacturing a dynamic random access memory, comprising:

forming a plurality of openings in a substrate;

forming a first hard mask on a sidewall of an upper part of each of the plurality of openings;

partially removing the substrate and the first hard mask to form a plurality of isolation trenches extending along a first direction and arranged along a second direction, and to define a plurality of active regions, wherein each of the plurality of active regions is located between the plurality of isolation trenches, and remaining portions of the first hard mask are located on two sides of each of the plurality of active regions;

filling the plurality of isolation trenches and the plurality of openings with a dielectric layer, wherein a material of the dielectric layer is different from a material of the first hard mask;

partially removing the substrate and the dielectric layer to form a plurality of buried word line trenches, wherein each of the plurality of buried word line trenches extends along a third direction and passes through the active regions, the openings and the isolation trenches, and the remaining portions of the first hard mask are located on two sides of each of the plurality of buried word line trenches; and forming a plurality of buried word lines in the plurality of buried word line trenches.

2. The method of manufacturing the dynamic random access memory according to claim 1, further comprising:

filling a lower part of each of the plurality of openings with a sacrificial layer before forming the first hard mask, wherein forming the plurality of isolation trenches comprises removing the sacrificial layer.

3. The method of manufacturing the dynamic random access memory according to claim 2, wherein the step of forming the plurality of openings in the substrate comprises:

forming a second hard mask on the substrate, and etching the substrate by using the second hard mask as mask, so as to form a plurality of shallow openings in the substrate;

forming a third hard mask on sidewalls of the plurality of shallow openings; and performing an etching process on the plurality of shallow openings and the substrate below the third hard mask to form the plurality of openings.

4. The method of manufacturing the dynamic random access memory according to claim 2, further comprising:

before forming the plurality of buried word line trenches, partially removing the substrate below the plurality of openings by using the remaining portions of the first hard mask as mask, so as to deepen the plurality of openings, wherein the width of the extended portion of each of the plurality of openings is less than the width of the lower part of each of the plurality of openings.

5. The method of manufacturing the dynamic random access memory according to claim 1, wherein forming the plurality of buried word lines comprises:

forming a liner layer and a conductive layer in the plurality of buried word line trenches;

partially removing the liner layer and the conductive layer, so that top surfaces of the plurality of buried word lines are lower than a top surface of the substrate;

removing the remaining portions of the first hard mask; and filling the plurality of openings and the plurality of buried word line trenches with a second dielectric layer so that the second dielectric layer covers the plurality of buried word lines.

6. The method of manufacturing the dynamic random access memory according to claim 5, wherein each of the plurality of buried word lines has a first width and a second width, and the first width is less than the second width, each of the plurality of buried word lines comprises:

first portions, located in the plurality of openings, of the plurality of buried word lines have the first width, and second portions, passing through the plurality of active regions, of the plurality of buried word lines have the second width.

7. The method of manufacturing the dynamic random access memory according to claim 1, wherein an included angle between the first direction and the third direction is an obtuse angle.

8. The method of manufacturing the dynamic random access memory according to claim 1, wherein the first hard masks have a width of at least 2 nm.

* * * * *